(12) United States Patent
Parks

(10) Patent No.: US 7,427,790 B2
(45) Date of Patent: Sep. 23, 2008

(54) IMAGE SENSOR WITH GAIN CONTROL

(75) Inventor: Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 72 days.

(21) Appl. No.: 11/624,773

(22) Filed: Jan. 19, 2007

(65) Prior Publication Data

US 2008/0173909 A1 Jul. 24, 2008

(51) Int. Cl.
*H01L 27/00* (2006.01)

(52) U.S. Cl. .................. 257/292; 257/225; 257/229; 348/308; 348/310

(58) Field of Classification Search .................. 257/281, 257/282, 283, 284, 285, 286, 287, 288, 289, 257/290, 291, 292, 293; 348/308, 310
See application file for complete search history.

(56) References Cited

U.S. PATENT DOCUMENTS

| | | | |
|---|---|---|---|
| 6,730,897 B2 | 5/2004 | Guidash | |
| 6,960,796 B2 | 11/2005 | Rhodes et al. | |
| 7,030,357 B2 * | 4/2006 | Lee | 250/208.1 |
| 7,075,049 B2 | 7/2006 | Rhodes et al. | |
| 2006/0103749 A1 | 5/2006 | He | |

\* cited by examiner

*Primary Examiner*—Marvin M. Lateef
*Assistant Examiner*—William A Harriston
(74) *Attorney, Agent, or Firm*—Peyton C. Watkins

(57) ABSTRACT

An image sensor having a plurality of pixels; each pixel includes one or more photosensitive elements that collect charge in response to incident light; one or more transfer mechanisms that respectively transfer the charge from the one or more photosensitive elements; a charge-to-voltage conversion region having a capacitance, and the charge-to-voltage region receives the charge from the one or more photosensitive elements; a first reset transistor connected to the charge-to-voltage conversion region; a second reset transistor connected to the first reset transistor, which in combination with the first reset transistor, selectively sets the capacitance of the charge-to-voltage conversion regions from a plurality of capacitances.

16 Claims, 6 Drawing Sheets

IMAGE SENSOR WITH GAIN CONTROL

FIELD OF THE INVENTION

The invention relates generally to the field of CMOS active pixel image sensor and, more particularly, to providing in pixel floating diffusion capacitance control.

BACKGROUND OF THE INVENTION

FIG. 1 shows the typical CMOS active pixel image sensor 100. The basic component of the image sensor 100 is the array of photosensitive pixels 130. The row decoder circuitry 105 selects an entire row of pixels 130 to be sampled by the correlated double sampling (CDS) circuitry 125. The analog-to-digital converter 115 scans across the column decoders and digitizes the signals stored in the CDS. The analog-to-digital converter 115 may be of the type which has one converter for each column (parallel) or one high-speed converter to digitize each column serially. The digitized data may be directly output from the image sensor 100 or there may be integrated image processing 120 for defect correction, color filter interpolation, image scaling, and other special effects. The timing generator 110 controls the row and column decoders to sample the entire pixel array or only a portion of the pixel array.

FIG. 2 shows one pixel of a CMOS image sensor. There is a photodiode 151 to collect photo-generated electrons. When the signal is read from the photodiode 151 the RG signal is pulsed to reset the floating diffusion node 155, via the reset transistor 150, to the VDD potential. The row select signal RSEL is turned on to connect the output transistor 153 to the output signal line through the row select transistor 154. CDS circuit samples the reset voltage level on the output signal line. Next the transfer transistor 152 is pulsed on and off to transfer charge from the photodiode 151 to the floating diffusion node 155. The new voltage level on the output signal line minus the reset voltage level is proportional to the amount of charge on the floating diffusion.

The magnitude of the floating diffusion voltage change is given by $V=Q/C$ where Q is the amount of charge collected by the photodiode 151 and C is the capacitance of the floating diffusion node 155. If the capacitance C is too small and the charge Q is too large, then the voltage output will be too large for the CDS circuit. This problem commonly occurs when the pixel size is 2.7 µm or larger and the power supply voltage VDD is 3.3 V or less. The prior art solution to this problem has generally consisted of placing extra capacitance on the floating diffusion node 155.

In FIG. 3, U.S. Pat. No. 6,730,897 increases the floating diffusion 160 node capacitance by adding a capacitor 161 connected between the floating diffusion 160 and GND. In FIG. 4, U.S. Pat. No. 6,960,796 increases the floating diffusion 162 node capacitance by adding a capacitor 163 connected between the floating diffusion 162 and the power supply VDD. The prior art does increase the floating diffusion node capacitance enough to ensure the maximum output voltage is within the power supply limit at maximum photodiode charge capacity. However, the prior art solution is not optimum for low light level conditions. When there is a very small amount of charge in the photodiode, the larger floating diffusion capacitance lowers the voltage output making it harder to measure the small signals. What is needed is a way to have a small floating diffusion capacitance (for increased voltage output) when imaging in low light levels and a large floating diffusion capacitance (to lower voltage output below the power supply range) when imaging in high light levels. This is a form of in pixel gain control.

FIG. 5 shows a pixel with an extra "dangling" transistor 165 connected to the floating diffusion 166. This pixel is from US Patent Application 2006/0103749A1. Switching on the transistor 165 with the AUX signal line increases the capacitance of the floating diffusion 166. This method of changing the floating diffusion capacitance requires four transistor gates 165, 167, 168, and 169 to closely surround and directly electrically connect to the floating diffusion. The presence of four transistor gates does not allow for the smallest possible floating diffusion node capacitance. When the transistor 165 is turned off, the gate still adds some additional capacitance compared to the case where only three transistors are adjacent to the floating diffusion.

U.S. Pat. No. 7,075,049 also shows pixels with the ability to change the floating diffusion node capacitance. It also has the requirement of four transistors adjacent to the floating diffusion node. Therefore, the pixel designs in U.S. Pat. No. 7,075,049 does not provide for the smallest possible floating diffusion capacitance.

The invention disclosed here will show how to build a pixel where the floating diffusion capacitance can be changed in response to signal level. Furthermore, the invention will only require three transistor gates to be adjacent to the floating diffusion.

SUMMARY OF THE INVENTION

The present invention is directed to overcoming one or more of the problems set forth above. Briefly summarized, according to one aspect of the present invention, the invention resides in an image sensor having a plurality of pixels; each pixel includes (a) one or more photosensitive elements that collect charge in response to incident light; (b) one or more transfer mechanisms that respectively transfer the charge from the one or more photosensitive elements; (c) a charge-to-voltage conversion region having a capacitance, and the charge-to-voltage region receives the charge from the one or more photosensitive elements; (d) a first reset transistor connected to the charge-to-voltage conversion region; (e) a second reset transistor connected to the first reset transistor, which in combination with the first reset transistor, selectively sets the capacitance of the charge-to-voltage conversion regions from a plurality of capacitances.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The invention allows for changing the image sensor pixel charge to voltage conversion capacitance without compromising the minimum possible capacitance.

DETAILED DESCRIPTION OF THE INVENTION

Before discussing the present invention in detail, it is instructive to note that the present invention is preferably used in, but not limited to, a CMOS active pixel sensor. Active pixel sensor refers to an active electrical element within the pixel, other than transistors functioning as switches. For example, the floating diffusion or amplifier are active elements. CMOS refers to complementary metal oxide silicon type electrical components such as transistors which are associated with the pixel, but typically not in the pixel, and which are formed when the source/drain of a transistor is of one dopant type and its mated transistor is of the opposite dopant type. CMOS devices include some advantages one of which is it consumes less power.

Figure 1:
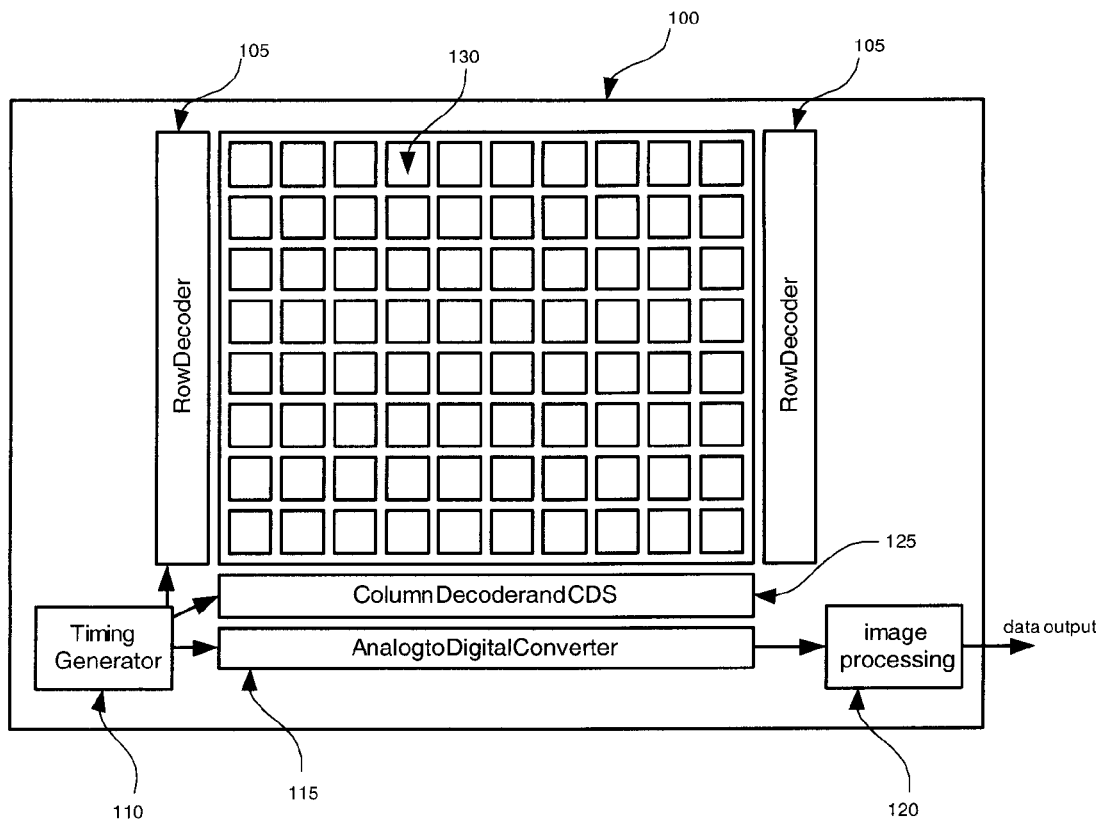
FIG. 1 is a prior art CMOS images sensor with integrated control electronics and signal processing.
Figure 2:
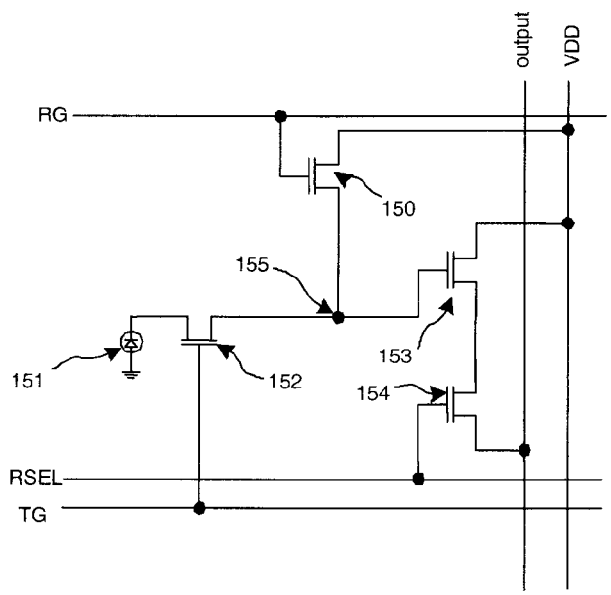
FIG. 2 is a prior art four-transistor pixel.
Figure 3:
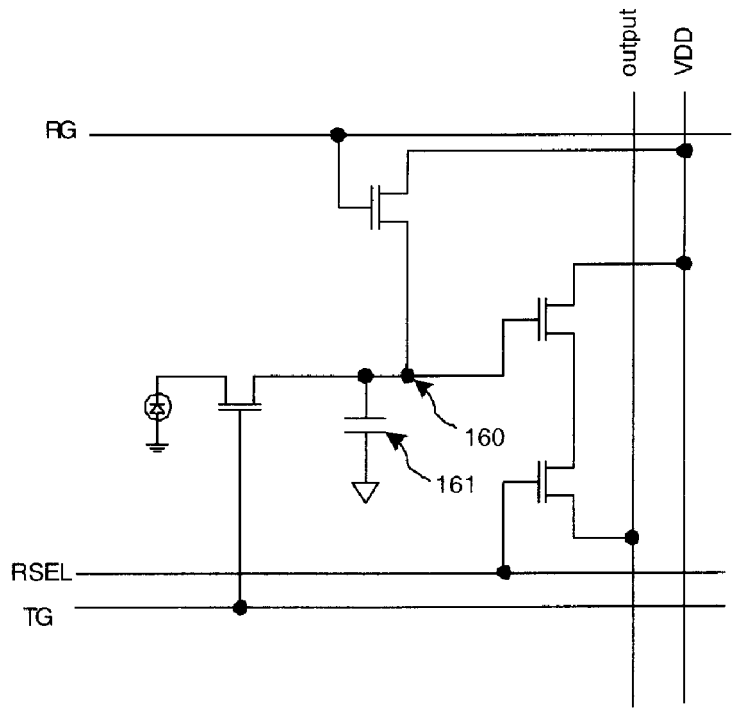
FIG. 3 is a prior art pixel with an extra floating diffusion capacitor connected to ground (zero volts)
Figure 4:
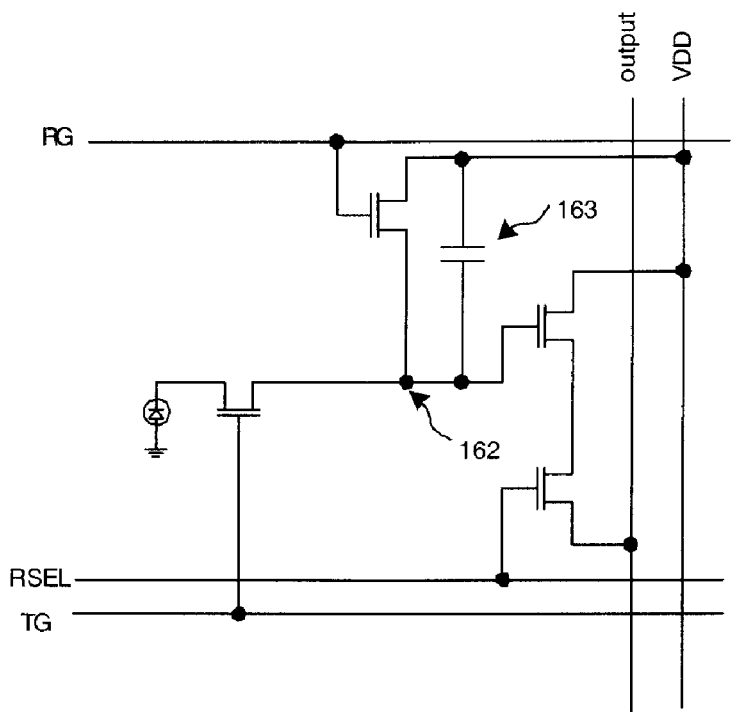
FIG. 4 is a prior art pixel with an extra floating diffusion capacitor connected to the power supply VDD.
Figure 5:
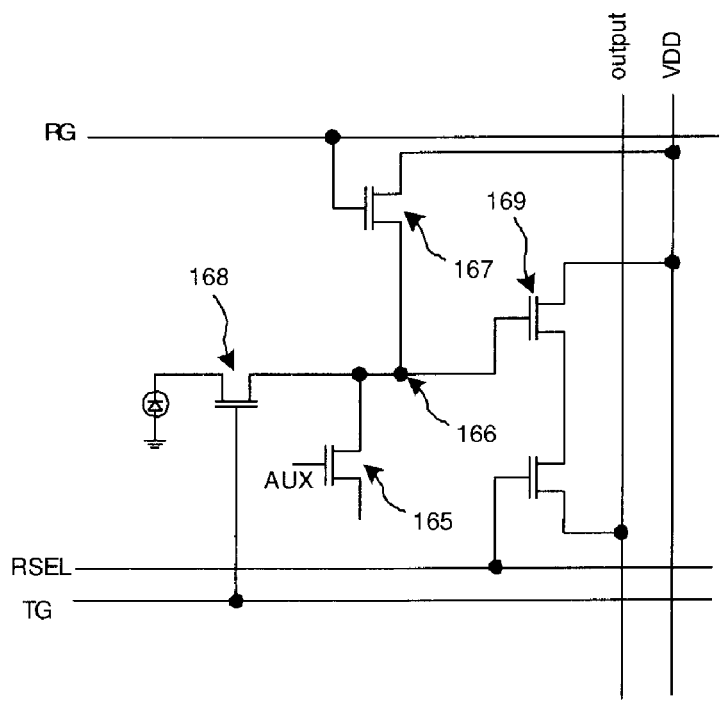
FIG. 5 is a prior art pixel with an extra floating diffusion capacitance control transistor attached to the floating diffusion.
Figure 6:
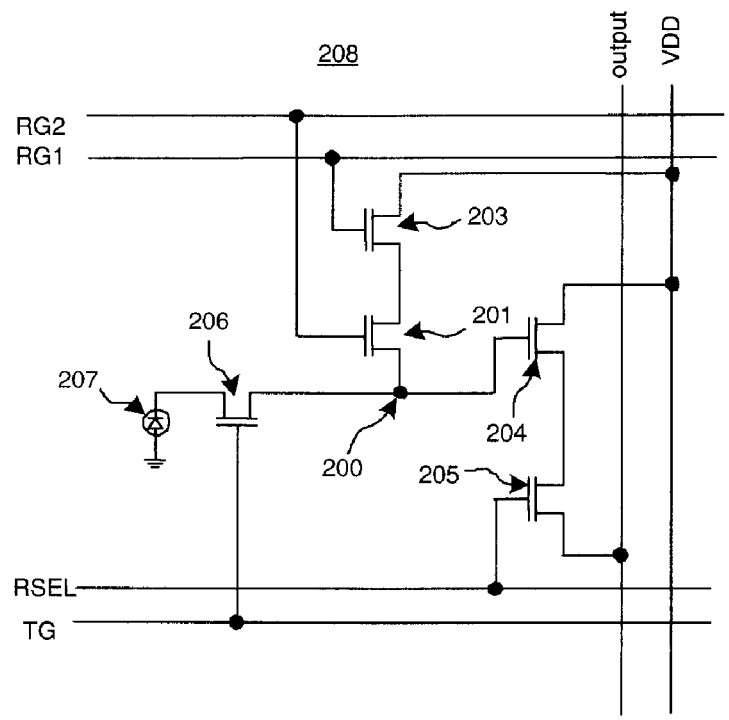
FIG. 6 is a schematic diagram of the present invention showing two reset transistors connected in series to the floating diffusion for capacitance control.

FIG. 6 is a schematic diagram of a pixel 208 having gain control of the present invention. It is noted that it only has three transistors adjacent to the floating diffusion node 200 while the prior art always had four transistors adjacent to the floating diffusion node. The three transistors are the transfer transistor 206 that controls the transfer of photo-generated charge from the photodiode 207 to the floating diffusion node 200, the reset transistor 201 and the output signal transistor 204. Transistor 205 is the row select transistor that is turned on to select which row is to have the output signal transistor 204 connected to the output signal line. Transistor 203 is a secondary reset transistor that allows changing of the floating diffusion capacitance when operated in conjunction with transistor 201.

Figure 7:
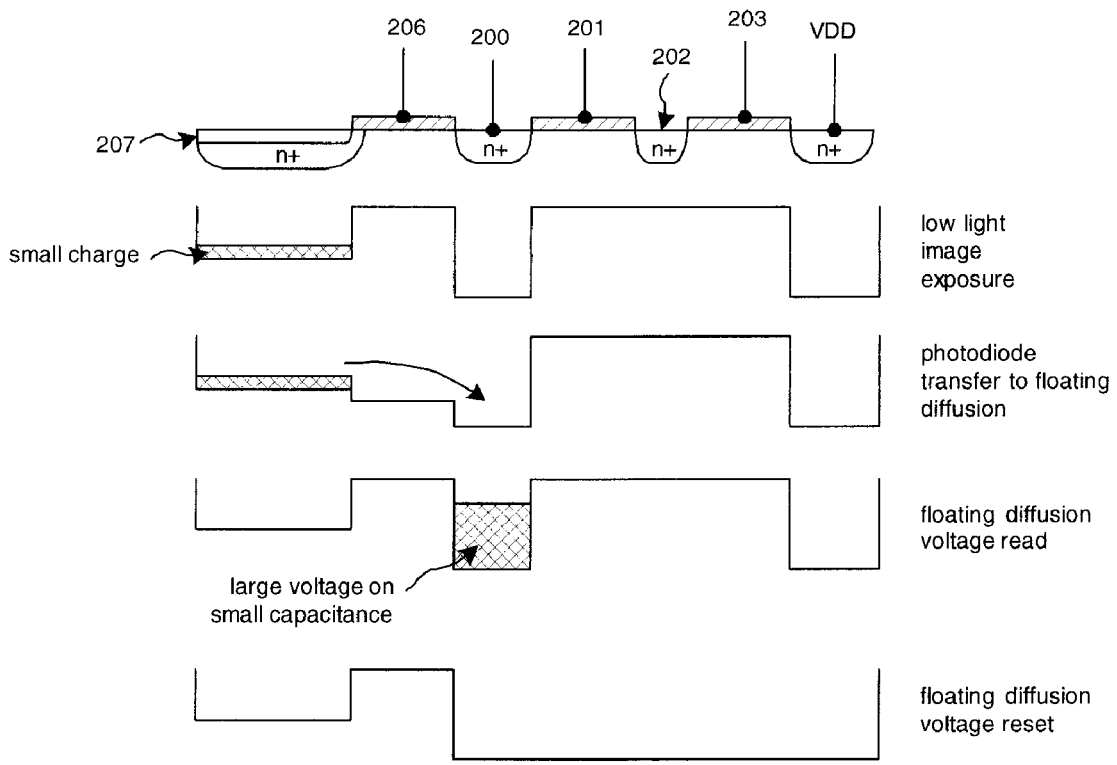
FIG. 7 illustrates the present invention operating in low capacitance high gain mode.
Figure 8:
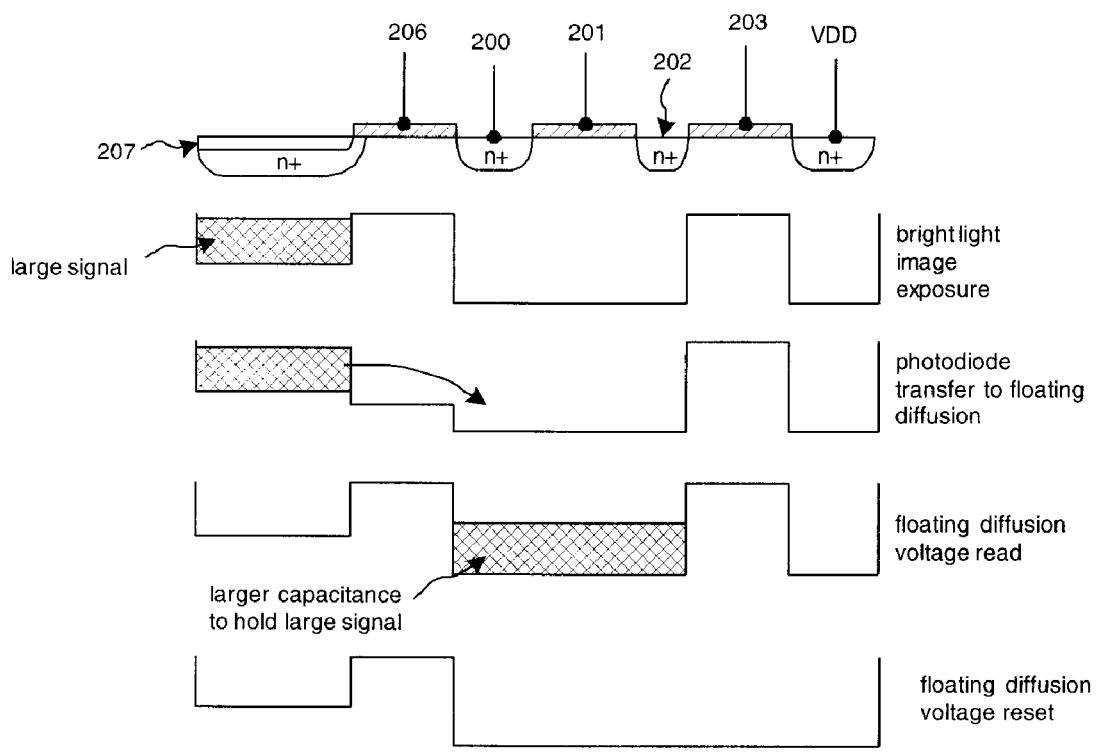
FIG. 8 illustrates the invention operating in high capacitance low gain mode.

The operation of the pixel is illustrated in FIGS. 7 and 8. First in FIG. 7, the pixel operation is in low capacitance (high gain) mode. This mode would be used in low light level conditions. The photodiode 207 has collected a small amount of photo-generated charge. In this case, it is desired to have the minimum floating diffusion 200 capacitance. To lower the capacitance, transistors 201 and 203 are turned off. It is noted, for clarity, that n+ doping 202 (diffusion) exists to form transistors 201 and 203. When the amount of photo-generated charge is measured the transfer gate 206 pulses on and then off to cause the transfer of charge from the photodiode 207 to the floating diffusion 200. The new voltage on the floating diffusion 200 is sampled through the output 204 and row select 205 transistors (as shown in FIG. 6). After the output is sampled, turning on both transistors 201 and 203 connects the floating diffusion to the VDD power to supply reset for the floating diffusion.

High capacitance (low gain) mode is illustrated in FIG. 8. In this case, the photodiode 207 has been exposed to bright light and has collected a large amount of photo-generated charge. This amount of charge would not fit on the floating diffusion node 200 in the low capacitance mode of FIG. 7. Therefore, in FIG. 8, the transistor 201 is turned on so now charge can spread out under the transistor gate 201 and the diffusion 202 also becomes part of the expanded floating diffusion. When charge is transferred from the photodiode 207 to the expanded floating diffusion, it fits onto the higher capacitance floating diffusion. The expanded floating diffusion is reset by pulsing the transistor 203 on and off.

Figure 9:
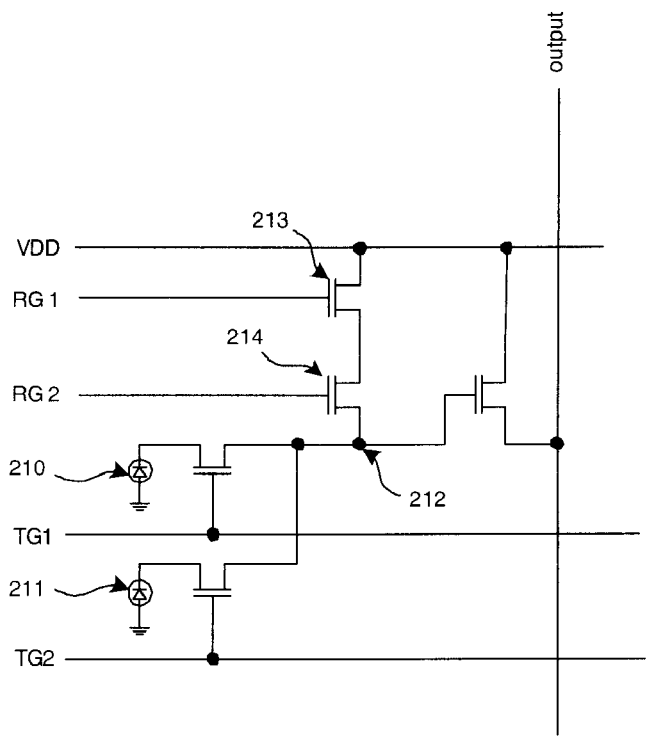
FIG. 9 illustrates the present invention in a pixel with multiple photodiodes connected to one shared floating diffusion.

FIG. 9 illustrates how the present invention can be applied to other types of pixels. FIG. 9 is a pixel with two photodiodes 210 and 211 connected by transfer gates to the floating diffusion 212. The invention places two reset transistors 213 and 214 in series to provide capacitance control of the floating diffusion 212. Hence, it is possible to apply the present invention to every pixel type having a floating diffusion connected to one or more transfer gates, one output transistor, and one reset transistor. The present invention replaces the reset transistor of a prior art pixel by two or more transistors placed in series between the floating diffusion and reset power supply node.

Figure 10:
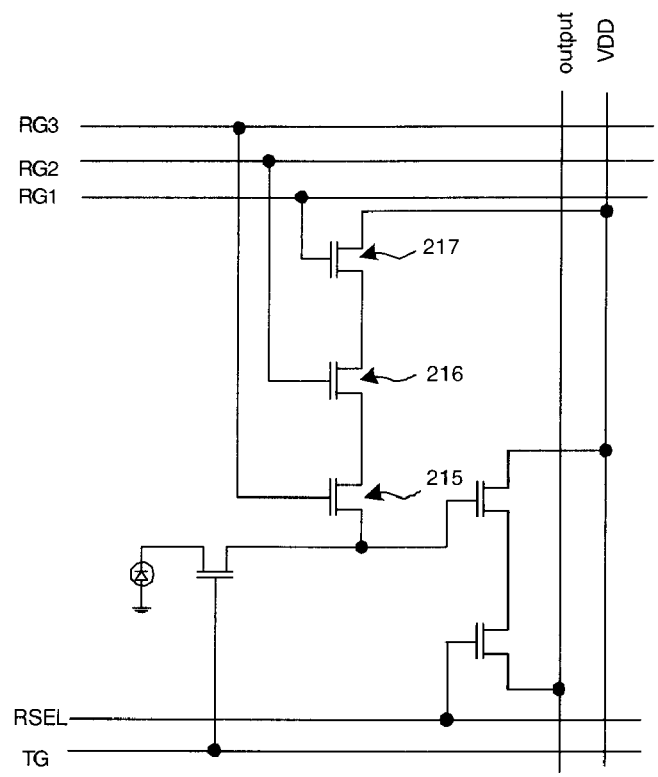
FIG. 10 illustrates the present invention with three reset transistors in series for two levels of floating diffusion capacitance control.

FIG. 10 illustrates how it is possible to have more than two levels of floating diffusion capacitance control by placing more than two reset transistors 215, 216, and 217 in series. The number of difference capacitance combinations in this case is equal to 2. For an arbitrary number of reset transistors, the number of capacitance combinations is N−1 where N is the number of reset transistors. It is also possible to replace transistor 216 by a set of transistors in parallel instead of in series. Placing the transistors in parallel would allow for a greater number of capacitance combinations than if they were all in series.

Figure 11:
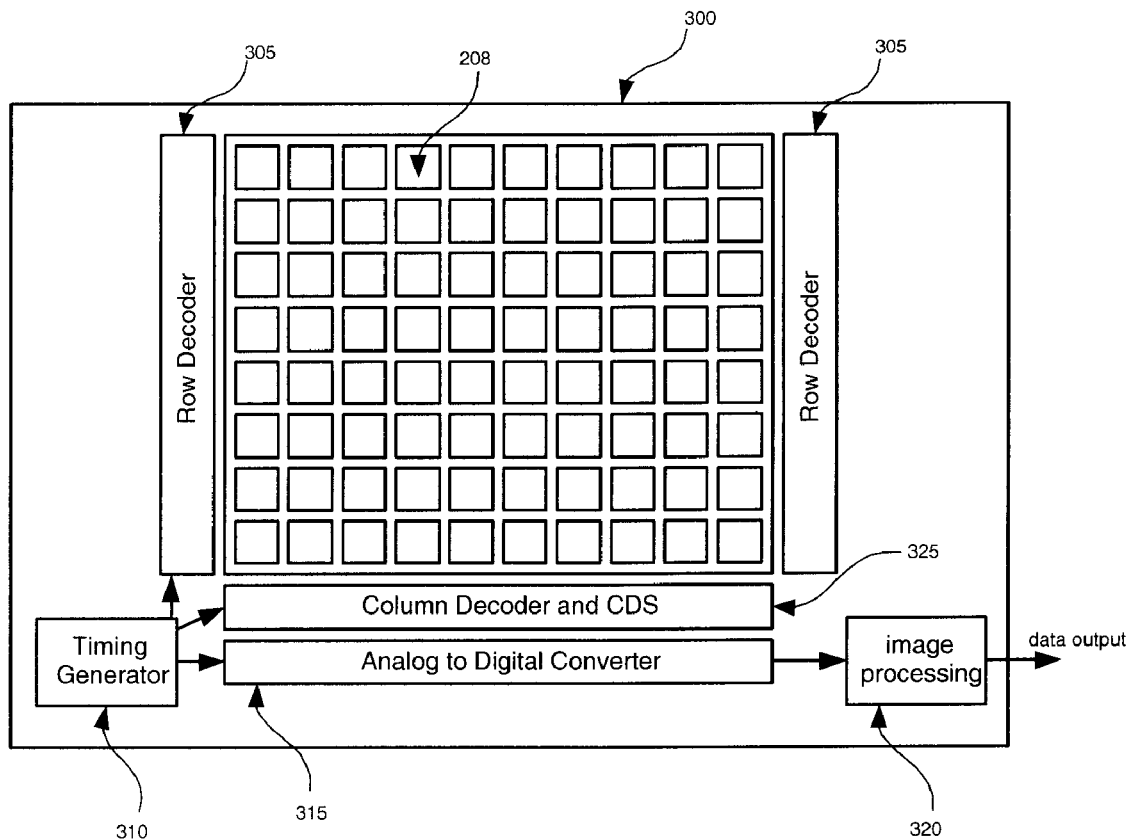
FIG. 11 is an image sensor of the present invention using a pixel with floating diffusion capacitance control.

FIG. 11 shows a CMOS active pixel image sensor 300 of the present invention having a pixel 208 of the present invention employing pixel level floating diffusion capacitance (or gain) control. The basic component of the image sensor 300 is the array of photosensitive pixels 208. The row decoder circuitry 305 selects an entire row of pixels 208 to be sampled by the correlated double sampling (CDS) circuitry 325. The analog-to-digital converter 315 scans across the column decoders and digitizes the signals stored in the CDS. The analog-to-digital converter 315 may be of the type that has one converter for each column (parallel) or one high-speed converter to digitize each column serially. The digitized data may be directly output from the image sensor or there may be integrated image processing 320 for defect correction, color filter interpolation, image scaling, and other special effects. The timing generator 310 controls the row and column decoders to sample the entire pixel array or only a portion of the pixel array.

Figure 12:
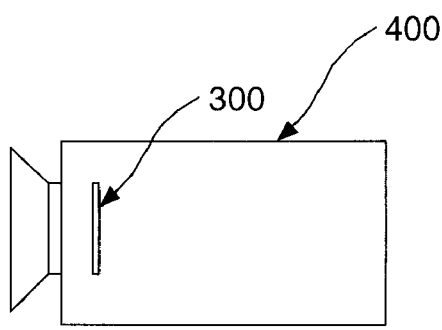
FIG. 12 is a camera imaging system having an image sensor using a pixel with floating diffusion capacitance control.

FIG. 12 shows the image sensor 300 employing a pixel level floating diffusion capacitance control in an electronic imaging system, preferably a digital camera 400.

The invention has been described with reference to a preferred embodiment. However, it will be appreciated that variations and modifications can be effected by a person of ordinary skill in the art without departing from the scope of the invention.

PARTS LIST 100 image sensor
105 row decoder circuitry
110 timing generator
115 analog-to-digital converter
120 integrated image processing
125 correlated double sampling (CDS) circuitry
130 array of photosensitive pixels
150 reset transistor
151 photodiode
152 transfer transistor
153 output transistor
154 row select transistor
155 floating diffusion node
160 floating diffusion
161 capacitor 162 floating diffusion
163 capacitor
165 "dangling" transistor/transistor gate
166 floating diffusion
167 reset transistor/transistor gate
168 transistor gate
169 transistor gate
200 floating diffusion
201 reset transistor/transistor gate
202 diffusion
203 secondary reset transistor
204 output signal transistor
205 row select transistor
206 transfer transistor/gate
207 photodiode
208 pixel/array of pixels
210 photodiode
211 photodiode
212 floating diffusion
213 reset transistor
214 reset transistor
215 reset transistor
216 reset transistor
217 reset transistor
300 image sensor
305 row decoder circuitry
310 timing generator
315 analog-to-digital converter
320 integrated image processing
325 correlated double sampling (CDS) circuitry
400 electronic imaging system (digital camera)

What is claimed is:

1. An image sensor having a plurality of pixels;
   each pixel comprises:
   (a) one or more photosensitive elements that collect charge in response to incident light;
   (b) one or more transfer mechanisms that respectively transfer the charge from the one or more photosensitive elements;
   (c) a charge-to-voltage conversion region having a capacitance, and the charge-to-voltage region receives the charge from the one or more photosensitive elements;
   (d) a first reset transistor connected to the charge-to-voltage conversion region; and
   (e) a second reset transistor connected to the first reset transistor, which in combination with the first reset transistor, selectively sets the capacitance of the charge-to-voltage conversion regions from a plurality of capacitances.

2. The image sensor as in claim 1, wherein the first and second reset transistors are connected in series.

3. The image sensor as in claim 2 further comprising a third transistor connected either in series or parallel to the second transistor for further selectively setting the capacitance of the charge-to-voltage conversion regions from a plurality of capacitances.

4. The image sensor as in claim 2 further comprising one or more third transistors connected either in series or parallel to the first transistor for further selectively setting the capacitance of the charge-to-voltage conversion regions from a plurality of capacitances.

5. The image sensor as in claim 1, wherein the charge-to-voltage conversion region is a floating diffusion.

6. The image sensor as in claim 5, wherein the first and second reset transistors are connected in series.

7. The image sensor as in claim 6 further comprising one or more third transistors connected either in series or parallel to the second transistor for further selectively setting the capacitance of the charge-to-voltage conversion regions from a plurality of capacitances.

8. The image sensor as in claim 6 further comprising one or more third transistors connected either in series or parallel to the first transistor for further selectively setting the capacitance of the charge-to-voltage conversion regions from a plurality of capacitances.

9. A camera comprising:
   an image sensor having a plurality of pixels;
   each pixel comprises:
   (a) one or more photosensitive elements that collect charge in response to incident light;
   (b) one or more transfer mechanisms that respectively transfer the charge from the one or more photosensitive elements;
   (c) a charge-to-voltage conversion region having a capacitance, and the charge-to-voltage region receives the charge from the one or more photosensitive elements;
   (d) a first reset transistor connected to the charge-to-voltage conversion region; and
   (e) a second reset transistor connected to the first reset transistor, which in combination with the first reset transistor, selectively sets the capacitance of the charge-to-voltage conversion regions from a plurality of capacitances.

10. The camera as in claim 9, wherein the first and second reset transistors are connected in series.

11. The camera as in claim 10 further comprising a third transistor connected either in series or parallel to the second transistor for further selectively setting the capacitance of the charge-to-voltage conversion regions from a plurality of capacitances.

12. The camera as in claim 10 further comprising one or more third transistors connected either in series or parallel to the first transistor for further selectively setting the capacitance of the charge-to-voltage conversion regions from a plurality of capacitances.

13. The camera as in claim 9, wherein the charge-to-voltage conversion region is a floating diffusion.

14. The camera as in claim 13, wherein the first and second reset transistors are connected in series.

15. The camera as in claim 14 further comprising one or more third transistors connected either in series or parallel to the second transistor for further selectively setting the capacitance of the charge-to-voltage conversion regions from a plurality of capacitances.

16. The camera as in claim 14 further comprising one or more third transistors connected either in series or parallel to the first transistor for further selectively setting the capacitance of the charge-to-voltage conversion regions from a plurality of capacitances.

* * * * *